United States Patent [19]

Kadomura

[11] Patent Number: 5,662,819

[45] Date of Patent: Sep. 2, 1997

[54] PLASMA PROCESSING METHOD WITH CONTROLLED ION/RADICAL RATIO

[75] Inventor: Shingo Kadomura, Kanagawa, Japan

[73] Assignee: Sony Corporation, Tokyo, Japan

[21] Appl. No.: 383,227

[22] Filed: Feb. 3, 1995

[30] Foreign Application Priority Data

Feb. 10, 1994 [JP] Japan .................................. 6-016563
Feb. 21, 1994 [JP] Japan .................................. 6-022478
Aug. 30, 1994 [JP] Japan .................................. 6-205282

[51] Int. Cl.$^6$ .............................. B44C 1/22; C03C 15/00; C03C 25/06; C23F 1/00
[52] U.S. Cl. ............................ 438/711; 216/70; 216/79; 216/68; 134/1.1; 438/732
[58] Field of Search ....................... 216/68, 70, 79; 156/643.1, 626.1, 653.1, 646.1, 657.1; 134/1.1

[56] References Cited

U.S. PATENT DOCUMENTS

| | | | |
|---|---|---|---|
| 4,985,112 | 1/1991 | Egitto et al. | 156/646.1 |
| 4,990,229 | 2/1991 | Campbell et al. | 156/345 |
| 5,047,115 | 9/1991 | Charlet et al. | 216/79 |
| 5,091,049 | 2/1992 | Campbell et al. | 156/643.1 |
| 5,280,154 | 1/1994 | Cuomo et al. | 156/646.1 |
| 5,304,282 | 4/1994 | Flamm | 156/643.1 |
| 5,366,586 | 11/1994 | Samukawa | 216/70 |
| 5,370,779 | 12/1994 | Ohba et al. | 216/70 |
| 5,376,223 | 12/1994 | Salimian et al. | 156/643.1 |
| 5,421,891 | 6/1995 | Campbell et al. | 156/345 |
| 5,429,070 | 7/1995 | Campbell et al. | 156/345 |
| 5,487,785 | 1/1996 | Horiike et al. | 204/298.16 |
| 5,567,268 | 10/1996 | Kadomura | 156/643.1 |
| 5,587,038 | 12/1996 | Cecchi et al. | 216/68 |

FOREIGN PATENT DOCUMENTS

| | | |
|---|---|---|
| 0 403 418 | 12/1990 | European Pat. Off. . |
| 0 552 491 | 7/1993 | European Pat. Off. . |
| 3-68773 | 3/1991 | Japan . |
| 6-112166 | 4/1994 | Japan . |

OTHER PUBLICATIONS

Extended Abstract to the 40th Lecture Meeting of the Society of Applied Physics, Spring Meeting of 1993, p. 529, Lecture No. 29p–ZE–6–8.

Primary Examiner—Glenn A. Caldarola
Assistant Examiner—J. Pasterczyk
Attorney, Agent, or Firm—Hill, Steadman & Simpson

[57] ABSTRACT

Controlling ion/radical ratio and monoatomic/polyatomic radical ratio in a process plasma provides improved processing performance during inductively-coupled plasma and/or helicon wave plasma processing of substrate materials. In a plasma processing method employing inductively coupled plasma, high frequency current to a high frequency antenna is intermittently supplied in a controlled manner to control the state of gas dissociation to promote formation of polyatomic radicals. In a plasma processing method employing helicon wave plasma, current supplied to a magnetic field generator is intermittently supplied in a controlled manner to promote formation of ions. In a preferred method both the high frequency current and magnetic field generating current are varied in a controlled manner to provide a variable plasma composition, i.e., radical rich plasma or ion-rich plasma, as desired, for improved plasma processing especially improved selective anisotropic dry etching at high etch rate.

5 Claims, 8 Drawing Sheets

PLASMA PROCESSING METHOD WITH CONTROLLED ION/RADICAL RATIO

BACKGROUND OF THE INVENTION

1. Field of the Invention

This invention relates to a plasma apparatus employed for fabrication of, for example, semiconductor devices, and a plasma processing method employing such plasma apparatus. More particularly, it relates to an apparatus allowing the gas dissociated state in a so-called high-density plasma, such as inductance-coupled plasma or helicon wave plasma to be controlled, and a method for carrying out plasma processing, such as dry etching, using such apparatus.

2. Description of the Related Art

As the integration degree of semiconductor devices proceeds to the stage of VLSIs and further to the stage of ULSIs, shrinkage in the minimum processing size is proceeding rapidly. For example, a design rule of 0.35 µm is adopted in a 64 MDRAM scheduled to be mass-produced in the near future. On the laboratory level, studies on ultra-fine processing based on the design rule of 0.25 to 0.1 µm are being conducted with a goal towards fabrication of semiconductor devices of the next and next-to-next generations.

The technique of dry etching consisting in etching a sample using ions or radicals in a plasma produced on discharge dissociation of an etching gas in a high vacuum chamber has contributed significantly to the progress in such fine processing technology. Among presently employed plasma generating systems, the electron cyclotron resonance (ECR) system and the magnetron␣RIE system are most prevalent.

It has however been found that certain limitations are met with the currently employed plasma if it is desired to produce a fine pattern with the minimum processing size of 0.25 µm or finer, as required in, for example, 256 MDRAMs.

For example, a strong magnetic field is employed in the above-mentioned ECR system or magnetron RIE system for increasing the plasma density. However, with the recent process employing a large gauge wafer 8 inches in diameter, it is difficult to produce a uniform magnetic field over the entire wafer surface. Thus the plasma density becomes nonuniform within the wafer plane, resulting in the tendency for gate insulating films to be destroyed. Another problem is that electrical charges accumulated on the substrate may produce an unusual etching shape due to difference in the capture ratio of electrons to ions with respect to the strong magnetic field effect in the ion incident direction.

Such a problem manifests itself by the generation of side etching to a W film 5e in the etching of an Al/W based laminated interconnect film, as shown for example in FIG. 1, in which the Al/W based laminated interconnect film on an, interlayer insulating film 1 is etched using a patterned photoresist 9 and a fluorine-based gas. It is thus seen that, while the desired shape anisotropy is obtained with a Ti film 2a and a TiN film 3a, making up a barrier metal layer 4a, an Al-1% Si film 6a and a TiON anti-reflection film 7a, side-etching is produced on a W film 5e.

Under the above-mentioned ultra-fine design rule, intrinsic anisotropic etching, based on a clean process not resorting to sidewall protection, is desired. It is however necessary in such cases to elongate the mean free path of ions by carrying out discharge under a low gas pressure.

Such low gas pressure discharge has an etching mechanism close to ion sputtering, and is crucial in the etching of a film of an $SiO_X$ based material for which sidewall protection is not intrinsically necessitated. The reason is that, with the coming into use of a multi-layer interconnection in a stacked capacitor in DRAMs, multi-layer polysilicon interconnection in a SRAM or a multi-layer interconnection in logic devices, a process of forming a connection hole having a high aspect ratio in a planarized thick $SiO_X$ based insulating film has made its debut.

However, under the low gas pressure, the chemical species in the plasma contributing to the etching are lowered in density thus raising problems such as a low etch rate or a low throughput. Consequently, for producing vanguard semiconductor devices, a demand is raised for a plasma apparatus in which the magnetic field can be lowered in the vicinity of a substrate and which is capable of generating a high-density plasma under a reduced gas pressure. Recently, a number of new types of high-density plasma apparatus have been proposed.

One of them is a helicon-wave plasma apparatus disclosed in JP Patent Kokai (Laid-Open) Publication No.3-68773 (1991). The plasma generating mechanism of the apparatus is that the helicon wave is generated in a cylindrical chamber by generating a magnetic field in the chamber and by applying the high frequency to a loop antenna wound about the chamber and the energy is transported from the helicon wave to electrons through the process of Landau damping for accelerating the electrons and colliding them against gas particles for producing a high ionization ratio. It is possible with the helicon wave plasma apparatus to achieve the ion density on the order of $10^{11}$ to $10^{13}/cm^3$ (16 to 20 mA/cm$^2$ in terms of the ion current density) under a low pressure on the order of $10^{-4}$ Torr. By the way, the ion density achievable with the ECE plasma apparatus is on the order of $10^{11}/cm^3$ (10 to 15 mA/cm$^2$ in terms of the ion current density) at most, depending on the operating conditions employed.

In the JP Patent Kokai (laid-Open) Publication No.8-112188, there is disclosed a plasma apparatus generating an inductively coupled plasma (ICP). With the plasma apparatus, the high frequency power is supplied to a non-resonant multi-turn antenna placed about a quartz cylinder defining a plasma generating chamber and electrons are rotated in accordance with the magnetic field formed within the antenna for colliding the electrons against the gas molecules at a high probability. With such ICP apparatus, the ion density on the order of $10^{11}$ to $10^{12}/cm^3$ can be achieved.

With the above-mentioned helicon wave plasma processing apparatus or ICP apparatus, since a strong magnetic field such as is employed in the conventional ECR system or magnetron system is not required for plasma generation, the magnetic field in the vicinity of the substrate can be significantly diminished or practically reduced to zero. Thus the nonuniform plasma density, ion oscillations or oblique ion incidence under the effects of the magnetic field may be significantly reduced for suppressing destruction of gate insulating films or unusual etching shape. On the other hand, since there is no necessity of employing a costly magnetic coil or a large-sized micro-wave generating apparatus, and an extremely high frequency used not be employed, the apparatus may be simplified and reduced in size and costs. This means a highly meritorious feature in consideration that the future tendency is towards the device fabricating apparatus having a multi-chamber construction.

However, there is presented such a problem that dissociation of gas molecules proceeds excessively in a low-pressure high-density plasma, such as ICP or a helicon-wave plasma, because of the extremely high electron temperature, as a result of which ions are generated in an excessive amount while radicals are generated in an insufficient amount.

In general, the high etch rate in dry etching is achieved in many cases by a so-called ion-assist mechanism in which the chemical reaction induced by radicals adsorbed on a sample surface is accelerated by the physical energy brought about by ion impact. Typical of such cases is the above-mentioned etching of the Al/W laminated interconnection layer. Consequently, in a system suffering from shortage in radicals, radical adsorption and ion irradiation are not repeated smoothly, thus lowering the etch rate.

In case of a system where ion sputtering plays the main part in the etching mechanism, relative shortage of certain radicals occasionally lead to lowered underlying layer selectivity. For example, when $c\text{-}C_4F_8$ (octafluorocyclobutane), a well-known etching gas for a layer of an $SiO_x$ based material, is employed, $CF_2*$, a precursor of a carbonaceous polymer contributing to Si selectivity, is generated in the conventional magnetron RIE device or ECR etching device, along with ions such as $CF_2^+$ $CF_3^+$, main etching species, for facilitating the progress of high speed high selectivity etching. However, within the ICP device or helicon wave plasma processing apparatus, dissociation of the etching gas proceeds excessively, such that monoatomic active species, such as $C^+$ or $F*$, are generated in larger quantities, while polyatomic ions or polyatomic radicals, such as those given above, are drastically reduced in quantities. The result is that the polymerization reaction of carbonaceous polymers is not induced to a sufficient extent such that Si selectivity is lowered.

In order to solve this problem, it is contemplated to add depositive gases, such as $CH_2F_2$ or $CHF_3$, to the etching gas system. This method resides in capturing excess $F*$ by taking advantage of $H*$ released from the depositive gases to raise the C/F ratio (ratio of the number of C atoms to that of F atoms) in the etching gas system for accelerating deposition of the carbonaceous polymer. However, for achieving a practically sufficient selectivity, an excess amount of the depositive gas needs to be added, which in turn tends to deteriorate the particle level or reproducibility.

As another method, the above-mentioned JP Patent Kokai (Laid-Open) Publication 6-112166 shows an ICP device in which a plate of electrically conductive silicon (Si) containing impurities at a higher concentration is employed as a member equivalent to an upper lid of a high-vacuum vessel. The Si plate captures a part of fluorine radicals ($F*$) generated in larger quantities in a plasma on its surface and discharges the captured radicals out of the high-vacuum vessel as $SiF_x$ for improving the Si selectivity. The Si plate is rendered electrically conductive so as to be utilized as a large-area dc grounding electrode for the plasma as well.

However, since the Si plate is significantly lower in electrical conductivity than metal, it is necessarily raised in resistance such that there is a risk that the substrate bias cannot be not applied effectively.

As a further method, there has been proposed in Extended Abstract to the 40th Lecture Meeting of the Society of Applied Physics, Spring Meeting of 1993, page 529, lecture number 29p-ZE-8, a method consisting in controlling gas dissociation using a pulse-modulated ECP plasma. More specifically, this method resides in temporally controlling electron multiplication and loss using the pulse-modulated micro-wave for varying the plasma electron temperature, thus suggesting the possibility of high precision etching. However, the ECR plasma apparatus is in need of large-sized costly equipment, such as solenoid coils or a micro-wave source, and hence is inferior to the helicon wave plasma apparatus in economic profitability or space efficiency in clean rooms.

OBJECTS AND SUMMARY OF THE INVENTION

It is an object of the present invention to provide a plasma apparatus capable of controlling the ion/radical ratio to an optimum value even in case of generating a high-density plasma such as a helicon wave plasma or ICP.

It is another object of the present invention to provide a plasma processing method capable of performing high-speed high-precision plasma processing, such as dry etching.

According to the present invention, there is provided a plasma apparatus comprising a vacuum vessel for accommodating a substrate therein, a portion of the wall of the vacuum vessel being formed of an electrically non-conductive material, a high-frequency antenna placed around the portion of the wall of the vacuum vessel formed of the electrically non-conductive material, and high-frequency electrical field control means for high-speed switching between supply and interruption of the high-frequency current to the high-frequency antenna. A high-density plasma is generated in this manner in the vacuum vessel.

The switching of supply/interruption of the high frequency current can be realized by switching the high-frequency current by a pulse signal by providing a pulse generating circuit between a high-frequency current source and a high-frequency antenna. The pulse length and the duty ratio are optimized depending on the types, speed of generation and life of the active species desired to be generated. If the pulse interval is set to 10 μsec or thereabouts, it becomes possible to lower only the electron temperature while the plasma density is maintained at approximately the same level during current interruption time as that during current supply time. The reason is that the relaxation time of the electron temperature is on the order of nanoseconds, whereas the plasma life is longer and amounts to tens of microseconds. By such setting, the electron temperature may be periodically changed, while maintaining the plasma discharge, for controlling the reaction of gas dissociation, sheath voltage on the substrate surface and the state of charge accumulation in the substrate.

With the above-described apparatus, inductively coupled plasma (ICP) may be induced in the vacuum vessel by coupling the high-frequency energy released from the high-frequency antenna to the vacuum vessel. The device for inducing the ICP is herein termed an ICP device.

If magnetic field generating means is provided on the outer side of the high-frequency antenna, a helicon-wave plasma can be induced within the vacuum vessel. The device for inducing the helicon-wave plasma is herein termed a helicon wave plasma device.

The helicon wave plasma device according to the present invention has magnetic field controlling means for switching between generation and extinction of the magnetic field by the magnetic field generating means.

For facilitating the switching of the magnetic field, the magnetic field generating means may be in the form of a solenoid and the current supply/interruption to the solenoid coil may be switched by the above-mentioned control means, more specifically, an electronic switch. The ion/radical ratio can be controlled to a desired value by suitably selecting the duration of the current supply time or the current duty cycle by such switching.

It is possible for the helicon wave plasma device according to the present invention to have both the high-frequency electrical field controlling means and the magnetic field controlling means. In such case, there are four different states of the presence and absence of the magnetic field and the high-frequency electrical field, depending on the switching timing of these two control means.

According to the present invention, there is also provided a method for processing a substrate accommodated in a vacuum vessel by pre-set plasma processing as an electrical field is intermittently generated within the vacuum vessel.

Specifically, the method may be carried out using the above-mentioned ICP device or helicon-wave plasma device for performing the pre-set plasma processing on the substrate contained in the vacuum vessel.

If the ICP device is employed, the pre-set plasma processing is carried out by intermittently generating the high-frequency electrical field by the high-frequency antenna and the high-frequency electrical field controlling means.

If the helicon-wave plasma processing is employed, the plasma processing may be carried out as the magnetic field is intermittently generated by the magnetic field generating means and the control means, although it is possible to control the high-frequency electrical field as described above. The process of performing the plasma processing as the magnetic field is intermittently generated and the process of performing the plasma processing as the magnetic field is continuously generated may be combined with each other chronologically. Since radicals are generated in larger quantities during intermittent magnetic field generation than during the continuous magnetic field generation, the sequence in which the two processes are carried out is determined depending on the desired contents of the plasma processing. The two processes may also be repeated alternately a desired number of times.

Such plasma processing may be applied to any known plasma processing operations, such as dry etching, CVD or surface modification. However, the plasma processing may be applied to dry etching with utmost effects since it is possible with the present invention to control the ion/radical ratio.

For example, the present invention may be advantageously applied to dry etching consisting in etching a film of a silicon compound on a substrate using a fluorocarbon based gas. There is no particular limitation to the types of the fluorocarbon compounds, which may be any known compounds used for etching the film of the $SiO_x$ based material. Since the amount of generation of F* may be suppressed to an optimum level by controlling the gas dissociation for preventing the C/F ratio of the etching reaction system from being lowered, there is no necessity of employing the depositive hydrofluorocarbon based gas in combination. The film of the silicon compound is typically a film of a $SiO_x$ based material, an SiN based material or a SiON based material, or a composite film of these films. Examples of the films of the $SiO_x$ include a coated film, such as a spin-on-glass (SOG) film, and any known $SiO_x$ based insulating films, formed by the CVD method, such as a PSG film, a BPSG film or an AsSG film.

Alternatively, the present invention may be applied to dry etching consisting in etching an interconnect film on the substrate using a halogen-based gas. Examples of such interconnect film include any known interconnect films usually etched by the ion assist mechanism, such as polysilicon film, polycide film, silicide film, an Al-based interconnect film or a high-melting metal film.

According to the present invention, the supply/ interruption of the high-frequency current to the high-frequency antenna may be switched at a fast rate for limiting the discharge time per discharge operation for controlling the state of gas dissociation. The discharge time and the state of gas dissociation are correlated with each other such that the saturation time of the density of the active species produced on dissociation of gas molecules differs with the types of the active species. In general, the larger the number of constituent atoms in the active species, and the larger the number of chemical bonds to be severed, the shorter is the discharge time required for generating them. Subsequently, as the discharge time lasts longer, active species with a smaller number of the constituent atoms or monoatomic chemical species are generated in increasing amounts.

Thus, by setting the duration of the supply time of the high-frequency current so as to permit desired active species to be generated in relatively larger quantities, and by Setting the duration of the interruption time of the high-frequency current taking into account the ratio of extinction of the active species due to recombination or collision against the wall of the high vacuum device, it becomes possible to suppress excess gas dissociation and to control various ratios, such as the ion/radical ratio or monoatomic radical/ polyatomic radical ratio.

In this manner, if the present invention is applied to dry etching of the film of the $SiO_x$ based material using the fluorocarbon based gas, it becomes possible to suppress generation of excess F* and to generate ions such as $CF_3^+$, $CF_2^+$ or $CF^+$, or $CF_2^*$, a precursor of the carbonaceous polymer, at an optimum ratio, such that high-speed anisotropic etching may be achieved while maintaining a high Si selectivity.

In the case of the helicon-wave plasma processing apparatus, a single helicon-wave plasma device may also be utilized as an ICP device by providing controlling means for switching between the generation and extinction of the magnetic field, thus making it possible to eke out radicals in shortage in the helicon-wave plasma with those in ICP. That is, the helicon-wave plasma device may be regarded as consisting in the ICP device and magnetic field generating means combined together. Since the helicon wave is a sort of electro-magnetic waves propagated in the plasma along the magnetic lines of force, it is not produced in the absence of a magnetic field, so that the helicon-wave plasma also is not induced. However, since the ICP is induced by the high-frequency antenna placed around the plasma generating chamber even in the absence of the helicon wave in the device, radical compensation becomes possible as described above.

According to the present invention, the helicon wave plasma rich in ions may be induced in the presence of the magnetic field, while the ICP rich in radicals may be induced on extinction of the magnetic field, such that the ion mode and the radical mode may be established at a desired ratio. If the magnetic field generating means is constituted by a solenoid coil, such magnetic field generation/ extinction may be achieved by simplified electric control, such that the ion/radical generation ratio may be controlled depending upon the duty cycle of current application.

If the helicon-wave plasma apparatus is applied to dry etching, the ion-assist mechanism, which fails to operate smoothly with the conventional helicon-wave plasma device, operates satisfactorily, thereby improving the etch rate.

On the other hand, since the state of gas dissociation may be controlled depending on the types of etching, such as etching in need of ions or etching in need of more radicals, high-precision dry etching may be achieved under an optimum ion to radical generation ratio while suppressing any unusual etching shape.

In sum, suppression of monoatomic radicals or control of the ion to radical generation ratio, which has been difficult to arrive at with the conventional helicon wave plasma, becomes possible through control of gas dissociation, thus rendering it possible to effect plasma processing with higher accuracy. In addition, since such dissociation control may be realized by connecting a pulse generating circuit in circuit with the current supply path to the high-frequency antenna, or by connecting a switch in circuit with the magnetic field impressing system, high economic profitability may be achieved, thus contributing to higher precision in the plasma processing and high integration of semiconductor devices.

BRIEF DESCRIPTION OF THE DRAWINGS

FIGS. 3A and 3B illustrate a second embodiment of the present invention, wherein FIG. 3A is a schematic cross-sectional view showing the state of a wafer prior to etching during the process of dry etching of an $SiO_x$ interlayer insulating film.

FIG. 3B is a schematic cross-sectional view showing the state of the wafer after a contact hole is bored through the $SiO_x$ interlayer insulating film.

FIGS. 7A and 7B illustrate a sixth embodiment of the present invention, wherein FIG. 7A is a schematic cross-sectional view showing the state of a wafer prior to etching during the process of dry etching of an Al-based interconnect film.

FIG. 7B is a schematic cross-sectional view showing the state in which the Al-based interconnection layer has been etched anisotropically.

FIG. 8A is a schematic cross-sectional view showing the state of the wafer prior to etching during the process of dry etching of an Al/W based laminated interconnect film.

FIG. 8B is a cross-sectional view showing the state in which a TiON antireflection film and an Al-1% Si film shown in FIG. 8A have been etched.

FIG. 8C is a schematic cross-sectional view showing the state in which a W film and a barrier metal layer of FIG. 8B have been etched.

DETAILED DESCRIPTION OF THE PREFERRED EMBODIMENTS

Figure 1:
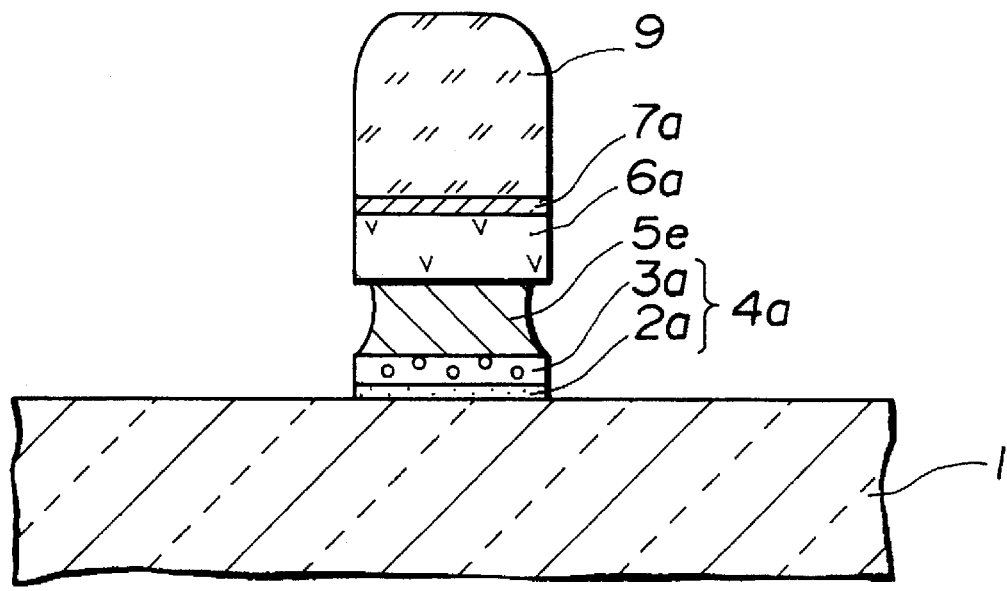
FIG. 1 is a schematic cross-sectional view showing the state in which side etching is induced in a W film during dry etching of an Al/W based laminated interconnect layer in the related art apparatus.

Referring to the drawings, preferred embodiments of the present invention will be explained in detail.

In the present embodiment, a typical construction of an ICP etching device having high-frequency electrical field controlling means is explained.

Figure 2:
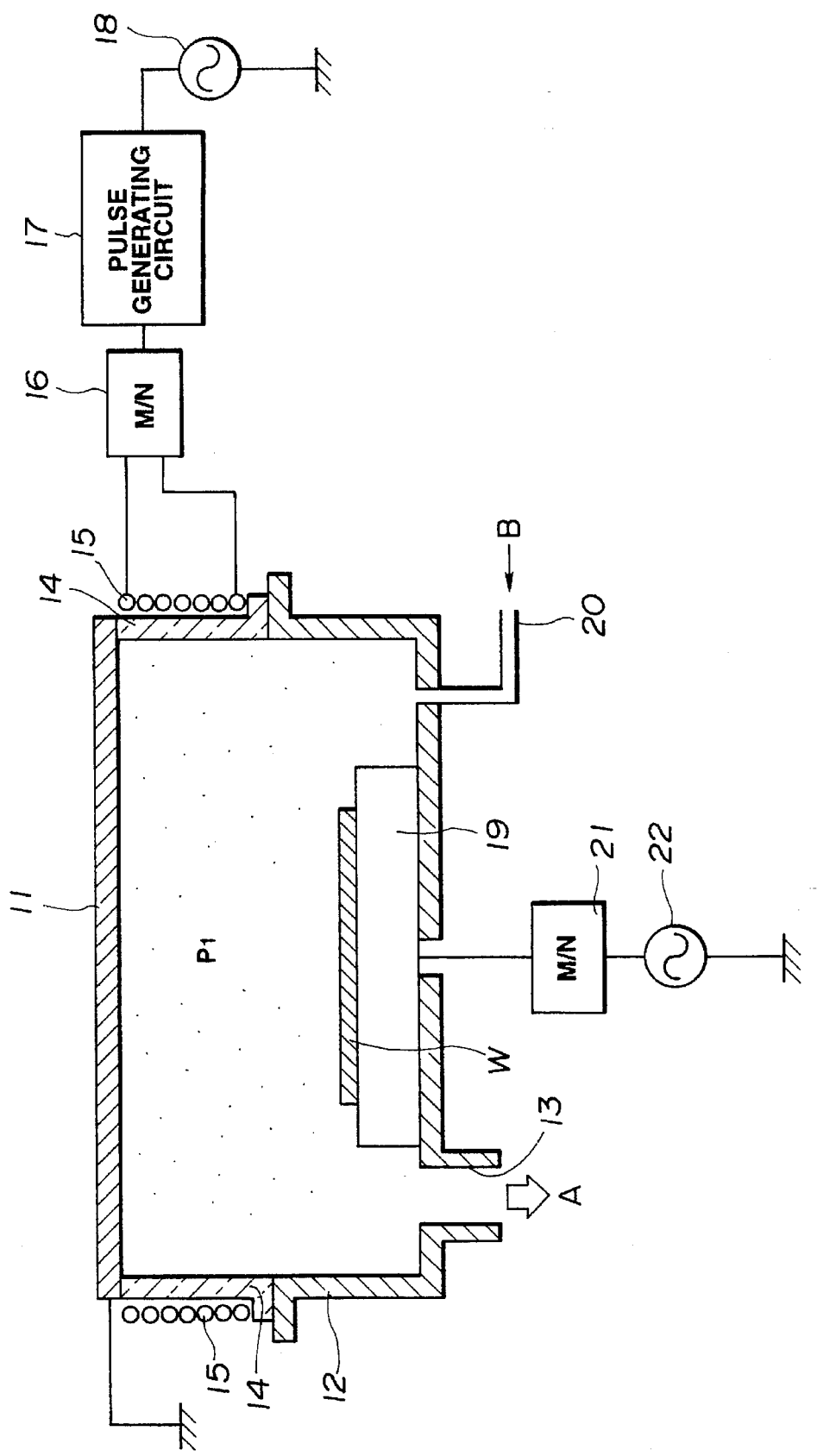
FIG. 2 is a schematic cross-sectional view showing a typical structure of an ICP etching device according to a first embodiment of the present invention.

FIG. 2 schematically shows an arrangement of an etching device according to a first embodiment of the present invention. The etching device has a processing chamber 12, the major portion of a wall surface and an upper lid 11 of which are formed of an electrically conductive material, such as stainless steel, and a portion of an axially extending section of which is in the form of a cylinder 14 formed of quartz. On the outer peripheral surface of the processing chamber 12 is placed a multi-turn antenna 15.

The inside space of the processing chamber 12 is evacuated to a high vacuum by an evacuating system, not shown, via an evacuating port 13, in the direction of an arrow A, and is fed with a gas required for dry etching via a gas supply duct 20 opened in the bottom surface in the direction of an arrow B. The processing chamber 12 also includes an electrically conductive substrate stage 19 electrically isolated from its wall surface. A wafer W, a substrate to be dry etched, is placed on the substrate stage 19. To the substrate stage is connected an RF power source 22, via a second matching network (M/N) 21, for applying a substrate bias to the wafer W for controlling the energy of ions incident from inside the inductively coupled plasma $P_I$. The RF power source for bias application 22 is set to a frequency of 13.56 MHz.

The most significant feature of the present device is that a pulse generating circuit 17 is provided in a current supply system to the multi-turn antenna 15. That is, the high-frequency current generated in an RF power source for plasma excitation 18 is switched by a pulse signal of a desired period and a desired duty ratio, generated by a pulse generating circuit 17, and the thus switched high frequency current is supplied via an impedance-matching first matching network M/N 16 to the multi-turn antenna 15. The EF power source for plasma excitation 18 is set to the frequency of 13.56 MHz.

Figure 3A:
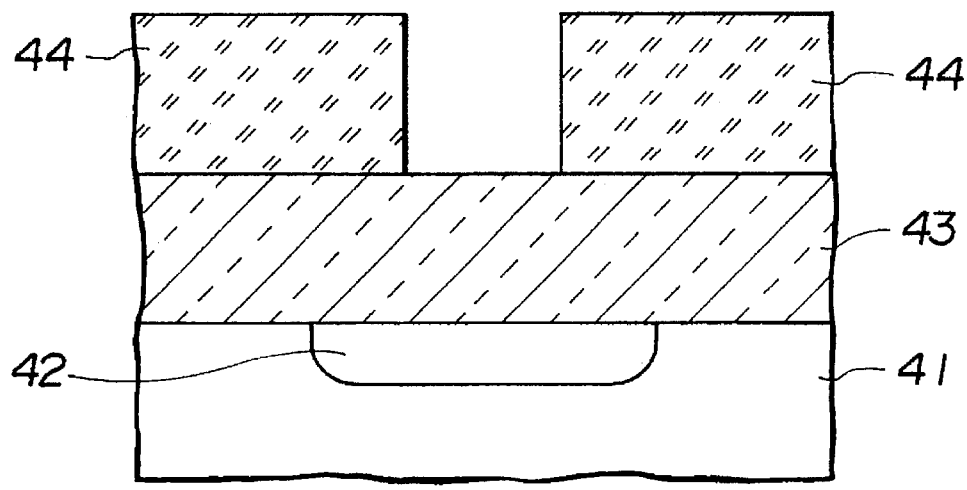
Figure 3B:
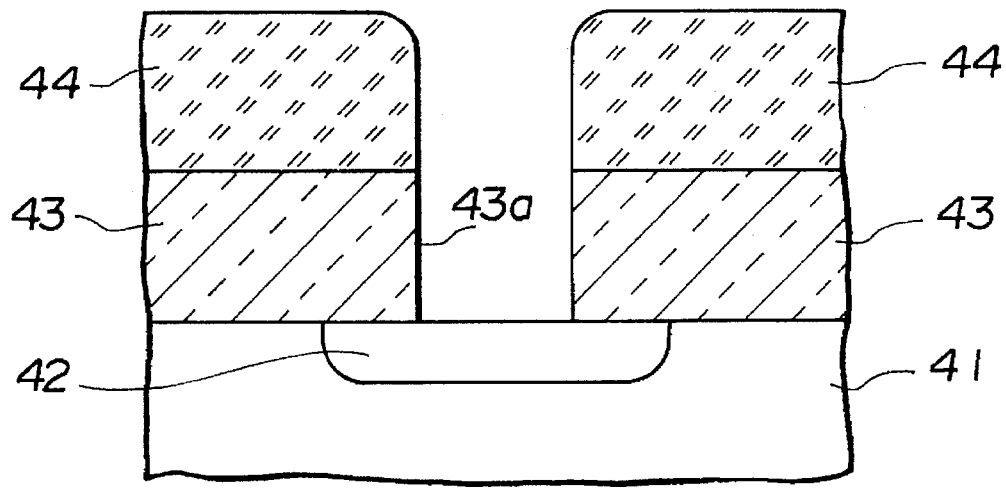

Referring to FIGS. 3A and 3B, a second embodiment of the present invention is explained.

In the present embodiment, an $SiO_x$ interlayer insulating film was etched using the ICP etching device explained in connection with Example 1.

FIG. 3A shows the cross-section of an essential portion of a wafer employed as an etching sample in the present embodiment. The wafer includes a single crystal Si substrate 41, on which an impurity diffusion layer 42 is formed as an underlying interconnection layer. On this substrate 41 is laminated an $SiO_x$ interlayer insulating film 43 by, for example, CVD and, on the interlayer insulating film, there is formed a resist mask 44 patterned by, for example, KrF excimer laser lithography.

This wafer was set on the substrate stage 19 of the etching device explained in connection with Example 1, and the $SiO_x$ interlayer insulating film 43 was etched under typical conditions of the c-$C_4F_8$ flow rate of 50 SCCM, a gas pressure of 0.13 Pa, a source power of 2,000 W (13.56 MHz), an RF bias power of 250 W (13.56 MHz) and a substrate stage temperature of −50° C., which was maintained using an alcoholic cooling medium.

If the conventional ICP etching device is employed, sufficient Si selectivity could not be achieved with the use of c-$C_4F_8$ alone, such that considerable hardware artifices were required, such as the upper lid 11 being formed of polysilicon containing impurities at a high concentration and heating of the upper lid 11. Conversely, with the present embodiment, c-$C_4F_8$ dissociation could be controlled satisfactorily by simply connecting the pulse generating circuit 17 in circuit with the current supply system, such that a contact hole 43a having a satisfactory cross-sectional profile could be formed with high reproducibility, as shown in FIG. 3B. The Si selectivity amounted to 50 or higher.

Figure 4:
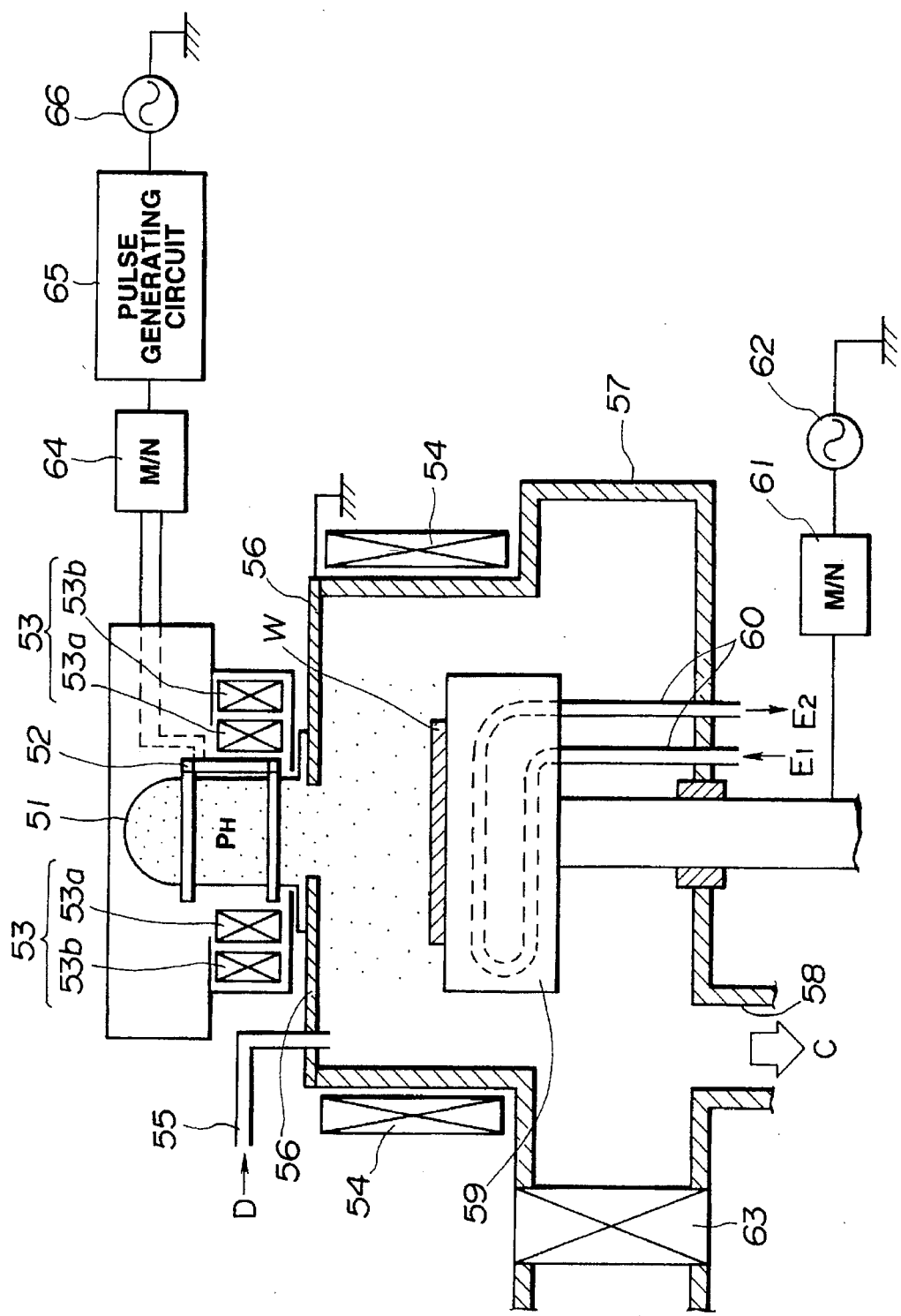
FIG. 4 is a schematic cross-sectional view showing a typical structure of a helicon wave plasma etching device having high frequency electrical field control means according to a third embodiment of the present invention.

Referring to FIG. 4, a third embodiment of the present invention is explained.

The present embodiment refers to a typical arrangement of a helicon wave plasma etching device having high-frequency electrical field controlling means.

FIG. 4 schematically shows the present etching device having a plasma source made up of a bell jar 51 of an electrically nonconductive material for generating a helicon wave plasma $P_H$, a loop antenna 52 having two loops encircling the bell jar 51 for coupling the high-frequency power (RF power) to the plasma, and a solenoid coil 58 mounted for encircling the bell jar 51 for generating a magnetic field extending along the axis of the bell jar 51.

The bell jar 51 is formed of, for example, quartz.

The solenoid coil 53 is of a dual structure and is comprised of an inner solenoid coil 53a mainly contributing to the propagation of the helicon wave and an outer solenoid coil 53b mainly contributing to the transport of the helicon wave plasma $P_H$.

The upper and lower loops of the loop antenna 52 have the current flowing through in mutually opposite directions. The distance between the two loops is optimized depending on the desired number of the helicon waves.

The bell jar 51 is connected to a processing chamber 57 for leading out the helicon wave plasma $P_H$ into the inside of the processing chamber 57 along the divergent magnetic field formed by the solenoid coil 53. The processing chamber 57 has its sidewall surface and the bottom surface formed of an electrically conductive material, such as stainless steel. The inside space of the processing chamber 57 is evacuated to high vacuum in the direction of an arrow C via an evacuating port 58 by an evacuating system, not shown, while being fed with a gas required for dry etching in the direction shown by an arrow D via a gas supply duct 55 opened in the upper lid 58. The processing chamber is connected to a load lock chamber, not shown, via a gate valve 63 formed in its sidewall surface.

Within the inside of the processing chamber 57 is accommodated an electrically conductive substrate stage 59 electrically insulated from the wall surface of the chamber 57. A wafer W as a substrate to be dry etched is set on the substrate stage 59. The substrate stage 59 is fitted with a cooling piping 60 by means of which it is supplied with a cooling medium from a chiller, not shown, circulated in the direction of arrows $E1_1$, $E_2$ for maintaining the wafer W being processed at a desired temperature.

To the substrate stage 59 is connected an RF power source 62 via a second matching network M/N 61 for controlling the energy of ions incident from inside the plasma. The Rf power source 62 is set to the frequency of 13.56 Hz.

On the outer side of the processing chamber 57 is arranged a magnet 54 for generating a multi-cusped magnetic field, as an auxiliary magnetic field generating means, for converging the divergent magnetic field in the vicinity of the substrate stage 59. The magnet 54 may also be mounted at some other position than outside the processing chamber, such as around a support pillar for the substrate stage 59. The magnet may also be replaced by a solenoid coil for generating a mirror field.

The most significant feature of the present device is that a pulse generating circuit 65 is provided in a current supply system to the loop antenna 52. That is, the high-frequency current generated in an RF power source for plasma excitation 68 is switched by a pulse signal of a desired period and a desired duty ratio, generated by the pulse generating circuit 65, and the thus switched high frequency current is supplied via an impedance-matching first matching network M/N 64 to the loop antenna 52. The RF power source for plasma excitation 66 is set to the frequency of 13.56 MHz.

Still referring to FIG. 4, a fourth embodiment of the present invention is explained.

The sample wafer employed in the present embodiment is similar in construction to that explained in FIG. 3.

This wafer was set on the substrate stage 59 of the above-described etching device and the interlayer insulating film 43 was etched under typical conditions of the c-$C_4F_8$ flow-rate of 50 SCCM, a gas pressure of 0.065 Pa, a source power of 2,000 W (13.56 MHz), an RF bias power of 150 W (13.56 MHz) and a substrate stage temperature of $-50°$ C., which was maintained using an alcoholic cooling medium. The pulse period and width of the pulses generated by the pulse generating circuit 85 were set to 60 μsec and 50 μsec, respectively.

If the helicon wave plasma etching device is employed, sufficient Si selectivity could not be achieved with the use of c-$C_4F_8$ alone, such that depositive $CH_2F_2$, which are not desirable, was added; thus lowering the particle level and reproducibility. However, in the present embodiment, active species such as $CF_X^+$ or $CF_2^*$ could be generated by controlling dissociation of c-$C_4F_8$ for suppressing excess generation of $F^*$. In this manner, a contact hole 43a having a satisfactory cross-sectional shape could be formed with high reproducibility, with Si selectivity of 50 or higher, as shown in FIG. 3B.

Figure 5:
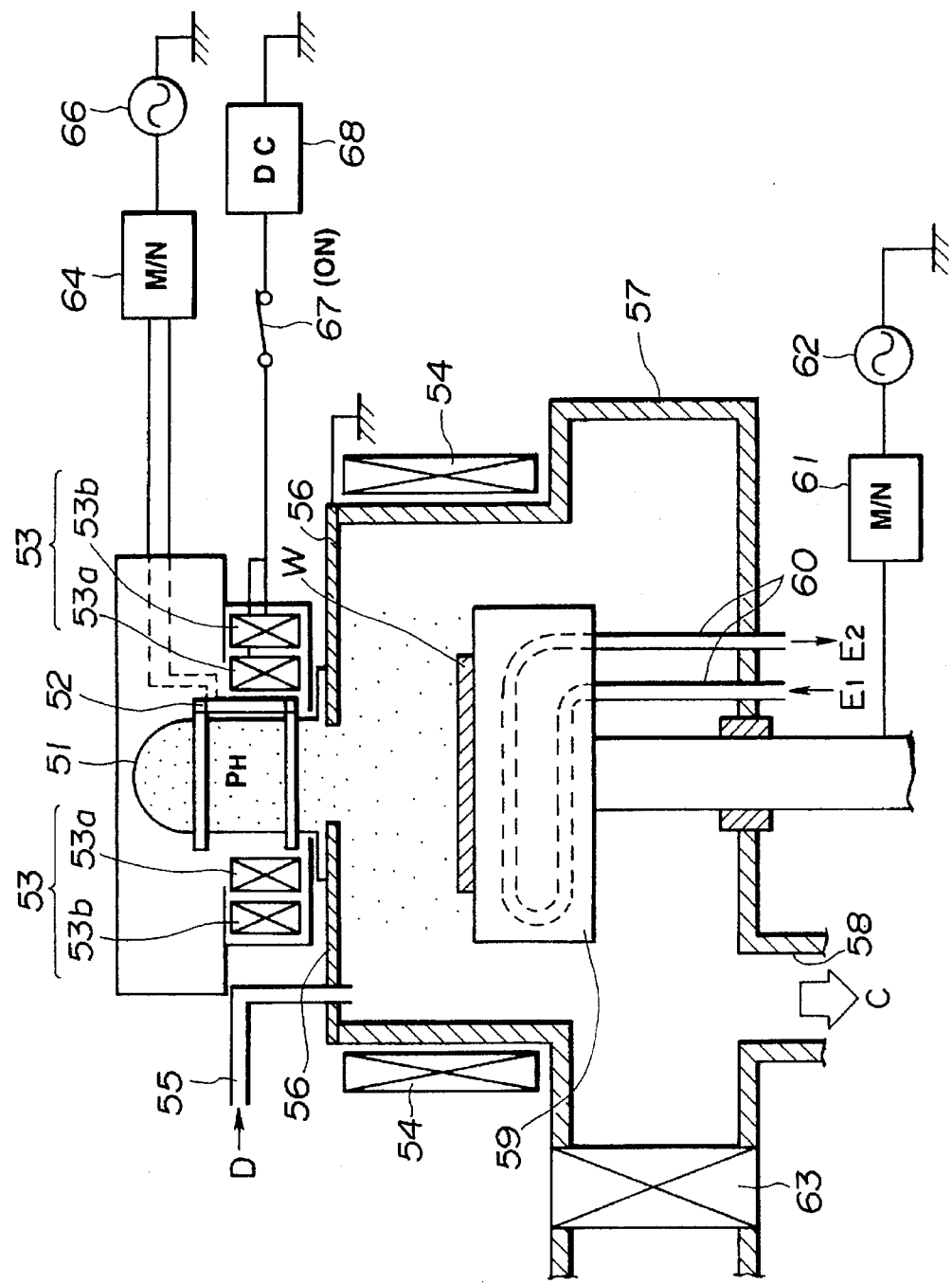
FIG. 5 is a schematic cross-sectional view showing a typical structure of a helicon wave plasma etching device having magnetic field control means according to a fifth embodiment of the present invention, and specifically showing the state in which a helicon wave plasma $P_H$ has been induced.
Figure 6:
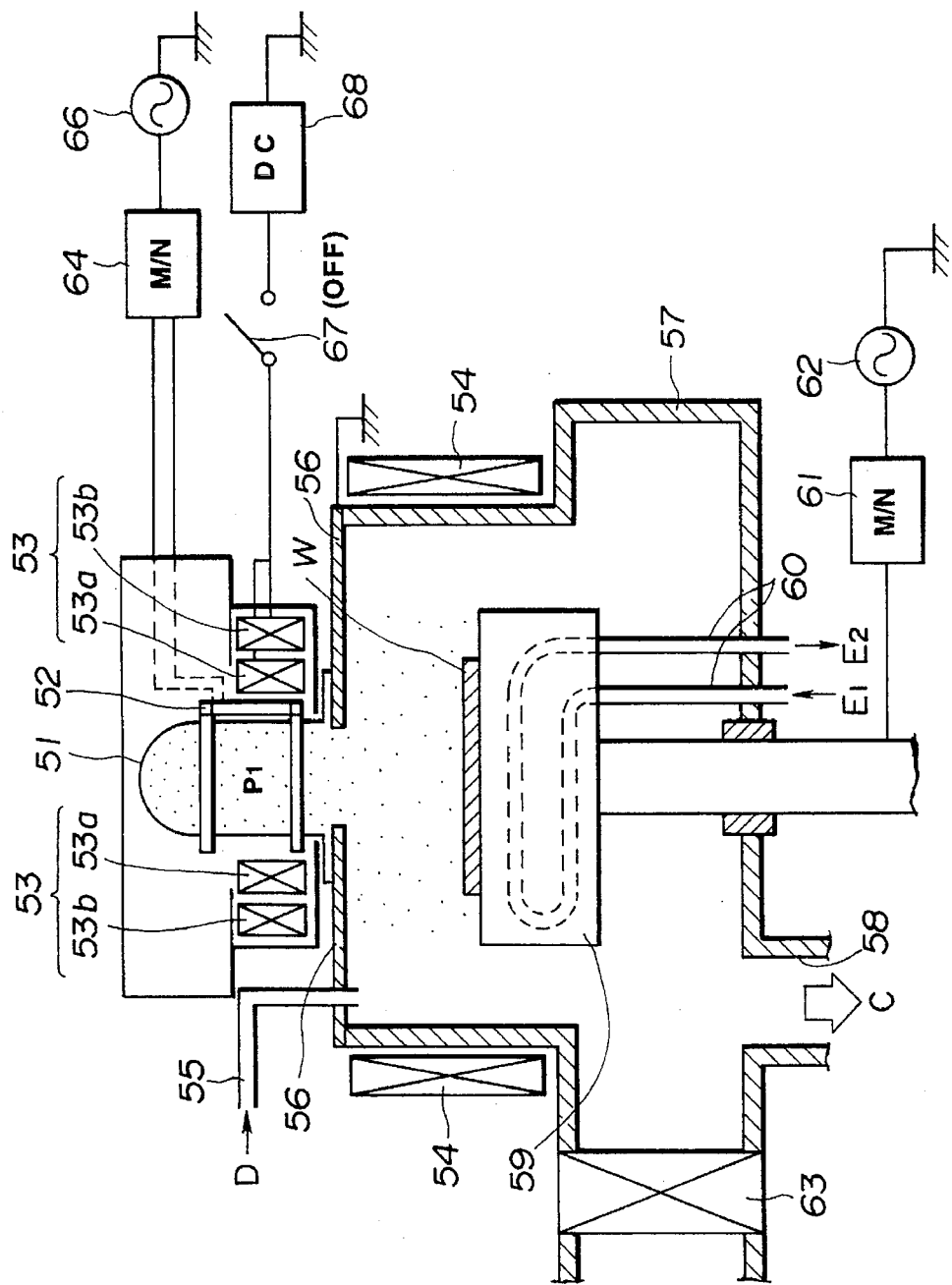
FIG. 6 is a schematic cross-sectional view showing the state in which an inductively coupled plasma PI has been induced.

Referring to FIGS. 5 and 6, a fifth embodiment of the present invention is explained.

The present invention refers to a typical arrangement of a helicon wave plasma etching device having magnetic field controlling means.

FIG. 5 schematically shows an arrangement of the present etching device. The parts common to those of the third embodiment are not specifically explained.

In distinction from the device of the third embodiment, the present device is not provided with the pulse generating circuit 65 in circuit with the power supply system to the loop antenna 52 and is supplied at all times with the high-frequency current from an RF source for plasma excitation 66.

A solenoid coil 53 is fed with the current from a dc source 68 via a switch 67.

If, with the present device, the switch 67 is turned on, as shown in FIG. 5, and the current is supplied to the solenoid coil 53 from a dc source 88, a helicon wave plasma $P_H$ is generated in the bell jar 51. Conversely, if the switch 67 is turned off, as shown in FIG. 6, there is produced no magnetic field in the bell jar 51, such that no helicon wave plasma is generated. However, since the high-frequency current is continuously supplied to the loop antenna 52, an inductively coupled plasma $P_I$ is induced in the bell jar 51. Thus the present device can be promptly switched to the helicon wave plasma $P_H$ or to the inductively coupled plasma $P_I$ responsive to the on/off state of the switch 67.

Figure 7A:
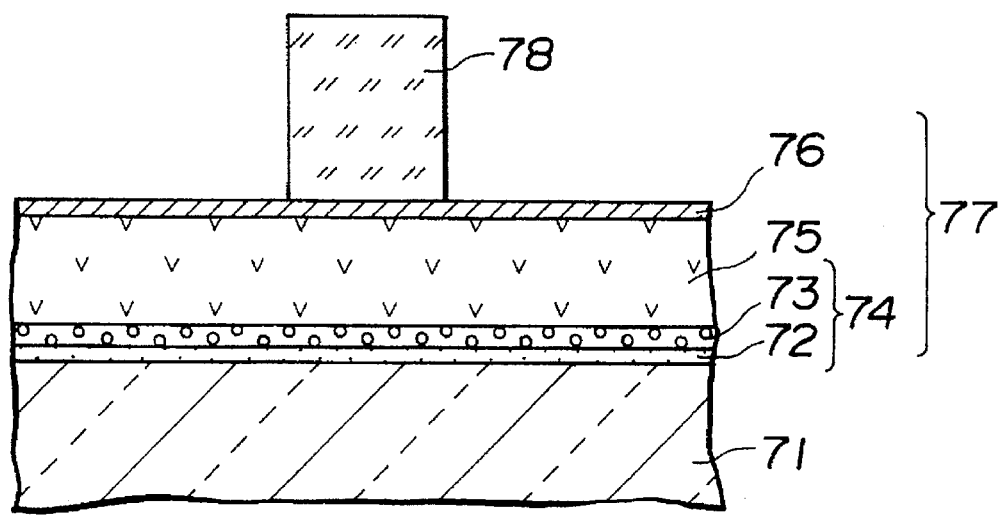
Figure 7B:
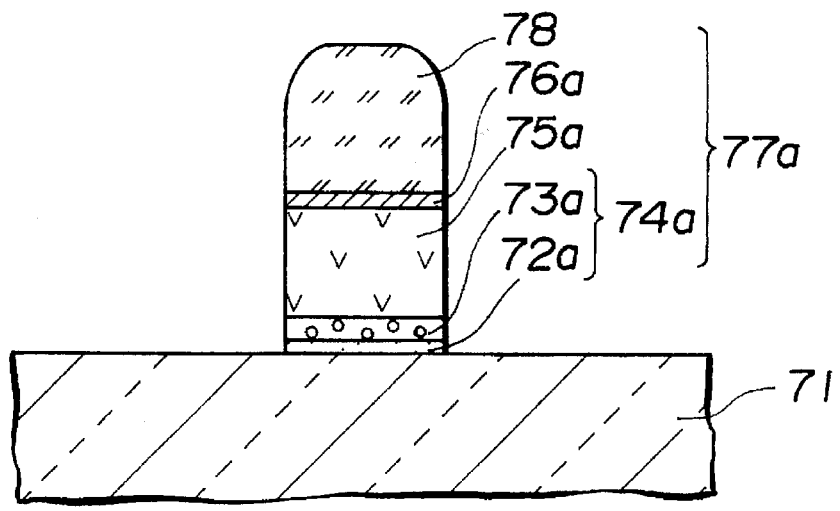

Referring to FIGS. 7A and 7B, a sixth embodiment of the present invention is explained.

In the present embodiment, an Al-based interconnection layer was etched using the helicon wave plasma etching device of the fifth embodiment described above. The etching process is explained by referring to FIGS. 7A and 7B.

FIG. 7A shows, in cross-section, a wafer employed as an etching sample for the present embodiment. The wafer comprises an $SiO_x$ interlayer insulating film 71 on which an Al-based interconnection layer 77 and a resist mask 78 having a pre-set pattern are formed in this order. The Al-based interconnection layer 37 is made up of a Ti-based barrier metal layer 74, an Al-1% Si film 73 and a TiON anti-reflection film 78, deposited in this order. The Ti-based barrier metal layer 74 is made up of a Ti film 72 and a TiN film 73, deposited in this order looking from the lower layer side.

The resist mask 78 is formed with a pattern 0.25 μm in width by KrF excimer laser lithography employing a chemical amplification resist material.

This wafer was set on the substrate stage 59 of the fifth embodiment and, with each of the on-state and the off-state of the switch 67 of five seconds, that is with the duty cycle of 50%, the Al-based interconnection layer 77 was etched under typical conditions of the $BCl_3$ flow rate of 20 SCCM, $Cl_2$ flow rate of 40 SCCM, an $N_2$ flow rate of 10 SCCM, a gas pressure of 0.05 Pa, a source power of 2500 W (13.56 MHz), an RF bias power of 100 W (13.56 MHz) and a substrate stage temperature of 40° C.

The crucial process of the present etching is the etching process of the Al-1% Si film 75. Since the etching of the Al-1% 1% Si film 75 proceeds essentially under the radical mode, a sufficient etch rate could not be obtained with the conventional helicon plasma etching device because of shortage of radical components. Conversely, since etching in the present embodiment proceeds under the mixed $P_H$-$P_I$ mode, that is the $P_H$ mode and the $P_I$ mode are repeated alternately, the ion assist mechanism operates effectively while the merit of low pressure discharge of assuring straight proceeding characteristics of active species and suppressing the micro-loading effects is exploited.

The result is that an Al-based interconnection pattern 77a having a satisfactory shape anisotropy as shown in FIG. 7B has been formed at a higher etch rate of 1 μm/minute.

Figure 8A:
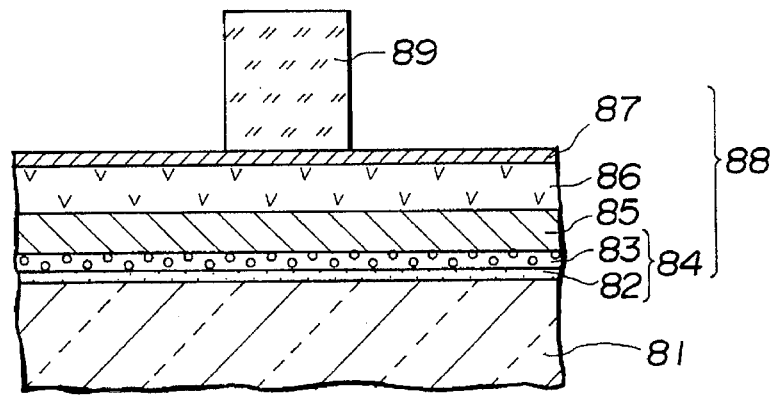
FIGS. 8A to 8C illustrate a seventh embodiment of the present invention, where
Figure 8B:
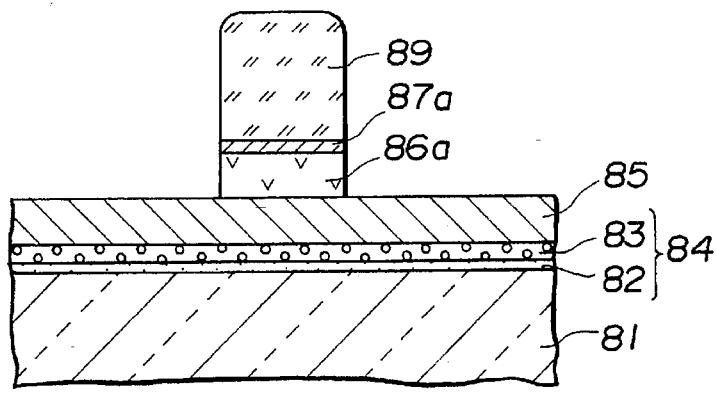
Figure 8C:
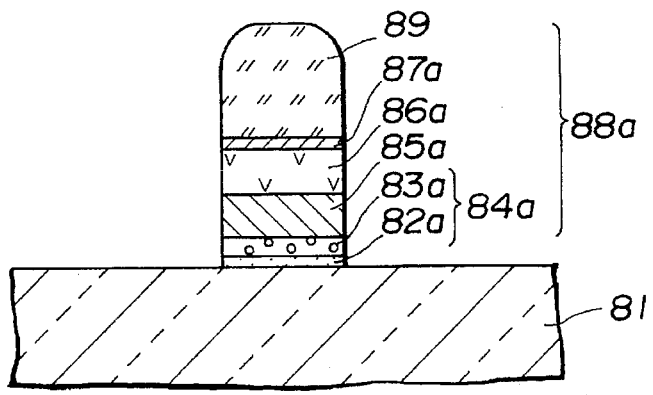

Referring to FIGS. 8A to 8C, a seventh embodiment of the present invention will be explained.

In the present embodiment, in etching the Al/W based laminated interconnection layer using the helicon plasma etching device explained in connection with the fifth embodiment, the Al-1% Si film and the W film were etched under the mixed $P_H$-$P_I$ mode and under the $P_H$ mode, respectively. This process is explained by referring to FIGS. 8A to 8C.

In FIG. 8A, a wafer employed as an etching wafer in the present embodiment is schematically shown in cross-section. The wafer comprises an $SiO_x$ interlayer insulating film 81 on which an Al/W laminated interconnection layer 88 is formed, and a resist mask 89 patterned to a pre-set shape is formed thereon. The Al-W based laminated interconnect film 88 is made up of a Ti-based barrier metal layer 85, an Al-1% Si layer 88 and a TiON antireflection layer 87, in this order. The Ti-based barrier metal layer 84 is made up of a Ti film 82 and a TiN film deposited in this order looking from the lower layer side.

The resist mask 89 is formed with a pattern 0.25 μm in width by KrF excimer laser lithography employing a chemical amplification resist material.

This wafer was set on the substrate stage 39 of the above-described dry etching device and the TiON anti-reflection film 87 and the Al-based interconnection layer 86 were etched under the mixed $P_H$-$P_I$ mode under typical conditions of the $BCl_3$ flow rate of 20 SCCM, $Cl_2$ flow rate of 40 SCCM, an $N_2$ flow rate of 10 SCCM, a gas pressure of 0.05 Pa, a source power of 2500 W (13.56 MHz), an RF bias power of 100 W (13.56 MHz) and a substrate stage temperature of 40° C. The current supply timing to the solenoid coil 53 for establishing the mixed $P_H$-$P_I$ mode as explained in connection with the sixth embodiment was used.

During this process, high-speed anisotropic etching proceeded by the ion-assist mechanism, and a TiON anti-reflection film pattern 87a and an Al-1% Si film pattern 88a were produced, as shown in FIG. 8B.

Then, for etching the remaining W film 85 and the barrier metal layer 84 using only the helicon plasma $P_H$, the switch 67 was turned on and the etching was carried out under illustrative conditions of the $SF_6$ flow rate of 40 SCCM, an $O_2$ flow rate of 10 SCCM, a gas pressure of 0.05 Pa, a source power of 2500 W (13.56 MHz), an RF bias power of 150 W (2 MHz) and a substrate stage temperature of 40° C.

The above-described anisotropic etching of the Al/W based laminated interconnection layer can be carried out with considerable technical difficulties and side etching is usually produced in the W film 85 with the conventional etching process as shown in FIG. 1. However, with the present embodiment, the Al/W based laminated interconnection pattern 88a having the satisfactory anisotropic shape as shown in FIG. 8C could be produced by carrying out the etching under mainly the ion sputtering mode under the ion-rich helicon wave plasma $P_H$ without producing undercuts even during over-etching.

The present invention is not limited to the above-described seven embodiments.

For example, both the RF power source for helicon wave plasma excitation and the RF power source for bias application are set to the frequency of 13.56 MHz. However, such frequency is merely illustrative. In addition, both the RF power sources may be set to respective different frequencies. Especially, since specific types of electrons can be accelerated in the case of the helicon wave plasma depending on the frequencies employed, an optimum frequency can be selected depending on the type of the targeted process.

The current supply timing to the solenoid coil or the duty ratio are also illustrative and are not limiting the invention.

In addition,the constitution of the dry etching device or the sample wafer or details of the dry etching conditions can be changed as desired.

What is claimed is:

1. A method for plasma processing a substrate comprising the steps of:

providing a vacuum vessel;

placing a substrate to be processed in the vacuum vessel;

introducing a process gas into said vessel;

generating an inductively coupled plaima in said vacuum vessel by providing a high frequency electric field in the vessel sufficient to create an inductively coupled plasma;

generating a helicon wave plasma in the vacuum vessel by providing a magnetic field in the vessel sufficient to create a helicon wave plasma;

controlling the ratio of ions to radicals in the plasma by switching the magnetic field on and of such that when the magnetic field is on a higher ratio of ions to radicals is provided and when the magnetic field is off, a lower ratio of ions to radicals is provided; and contacting said substrate with said helicon wave plasma.

2. A method as defined in claim 1, further comprising the step of controlling dissociation of the process gas to monoatomic radicals and ions by switching the high frequency electric field on and off periodically in a manner which maintains the inductively coupled plasma and promotes formation of polyatomic radicals and ions over monoatomic radicals and ions.

3. A method, as defined in claim 1, wherein the substrate is exposed to the helicon wave plasma in which the ratio of ions to radicals is controlled by switching the magnetic field on and off periodically for a first period of time and thereafter the substrate is exposed to ion-rich helicon wave plasma wherein the magnetic field is maintained in a continuous on condition for second period of time.

4. A method as defined in claim 1, wherein the substrate is exposed to ion-rich helicon wave plasma for a first period of time by maintaining the magnetic field in a continuous on condition and thereafter the substrate is exposed to the helicon wave plasma in which the ratio of ions to radicals is controlled by switching the magnetic field on and off periodically for a second period of time.

5. A method according to claim 1, wherein the substrate includes a silicon compound disposed thereon, the process gas is a fluorocarbon gas and the substrate is dry etched in the plasma processing.

* * * * *